US012057295B2

(12) United States Patent
Luo et al.

(10) Patent No.: US 12,057,295 B2
(45) Date of Patent: Aug. 6, 2024

(54) RF POWER COMPENSATION TO REDUCE DEPOSITION OR ETCH RATE CHANGES IN RESPONSE TO SUBSTRATE BULK RESISTIVITY VARIATIONS

(71) Applicant: LAM RESEARCH CORPORATION, Fremont, CA (US)

(72) Inventors: Wei Yi Luo, Fremont, CA (US); Youn Gi Hong, Pleasanton, CA (US); WeiWu Zhong, San Jose, CA (US); Himanshu Chokshi, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 581 days.

(21) Appl. No.: 17/267,525

(22) PCT Filed: Aug. 8, 2019

(86) PCT No.: PCT/US2019/045648
§ 371 (c)(1),
(2) Date: Feb. 10, 2021

(87) PCT Pub. No.: WO2020/036801
PCT Pub. Date: Feb. 20, 2020

(65) Prior Publication Data
US 2021/0313152 A1  Oct. 7, 2021

Related U.S. Application Data

(60) Provisional application No. 62/765,244, filed on Aug. 17, 2018.

(51) Int. Cl.
*H01J 37/32* (2006.01)
*C23C 16/455* (2006.01)
(Continued)

(52) U.S. Cl.
CPC .. *H01J 37/32183* (2013.01); *C23C 16/45536* (2013.01); *C23C 16/45544* (2013.01);
(Continued)

(58) Field of Classification Search
None
See application file for complete search history.

(56) References Cited

U.S. PATENT DOCUMENTS 4,310,812 A   1/1982  DeBloois
5,556,549 A   9/1996  Patrick et al.
(Continued)

FOREIGN PATENT DOCUMENTS

CN   1596061 A    3/2005
TW    509982 B   11/2002
(Continued)

OTHER PUBLICATIONS

International Search Report and Written Opinion of the ISA issued in PCT/US2019/045648, mailed on Nov. 29, 2019; ISA/KR.
(Continued)

*Primary Examiner* — Shamim Ahmed

(57) ABSTRACT

A substrate processing system includes a plasma generator configured to supply (radio frequency) RF power to an electrode arranged in a processing chamber. A sensor is configured to sense a parameter of the RF power supplied to the electrode. A controller is configured to compensate variations in a rate of a plasma process due to variations in bulk resistivity of a substrate arranged on a substrate support by causing the sensor to sense the parameter at least one of prior to plasma processing of the substrate and after a predetermined period after the plasma processing of the substrate begins; and adjusting the parameter of the RF power for the substrate during the plasma processing of the substrate based on the parameter sensed for the substrate.

21 Claims, 9 Drawing Sheets

(51) Int. Cl.
    *C23C 16/50*      (2006.01)
    *C23C 16/52*      (2006.01)
(52) U.S. Cl.
    CPC .............. *C23C 16/50* (2013.01); *C23C 16/52* (2013.01); *H01J 37/3299* (2013.01); *H01J 2237/332* (2013.01); *H01J 2237/334* (2013.01)

(56) References Cited

U.S. PATENT DOCUMENTS

| | | | |
|---|---|---|---|
| 8,895,415 | B1 | 11/2014 | Fox et al. |
| 9,741,579 | B2* | 8/2017 | Tamari .............. H01J 37/32568 |
| 2005/0081999 | A1 | 4/2005 | Yasui et al. |
| 2009/0297404 | A1 | 12/2009 | Shannon et al. |
| 2012/0146508 | A1 | 6/2012 | Nagarkatti et al. |
| 2016/0118227 | A1 | 4/2016 | Valcore, Jr. et al. |
| 2017/0004955 | A1* | 1/2017 | Leeser ................. G01R 21/133 |
| 2017/0228482 | A1* | 8/2017 | Tetiker .................... G06F 30/39 |
| 2017/0278676 | A1* | 9/2017 | Nagami ............ H01J 37/32091 |
| 2018/0173255 | A1* | 6/2018 | Wetzel ............... G05D 23/2401 |

FOREIGN PATENT DOCUMENTS

| | | |
|---|---|---|
| TW | 201003776 A | 1/2010 |
| TW | 201031280 A | 8/2010 |
| TW | 201816887 A | 5/2018 |

OTHER PUBLICATIONS

Office Action issued in corresponding Taiwanese Patent Application 108128869 dated Jan. 10, 2023.

Office Action issued in corresponding Chinese Patent Application 2019800683700.X dated Sep. 5, 2023.

* cited by examiner

RF POWER COMPENSATION TO REDUCE DEPOSITION OR ETCH RATE CHANGES IN RESPONSE TO SUBSTRATE BULK RESISTIVITY VARIATIONS

CROSS-REFERENCE TO RELATED APPLICATIONS

This application is a U.S. National Phase Application under 35 U.S.C. 371 of International Application No. PCT/US2019/045648, filed on Aug. 8, 2019, which claims the benefit of U.S. Provisional Application No. 62/765,244, filed on Aug. 17, 2018. The entire disclosures of the applications referenced above are incorporated herein by reference.

FIELD

The present disclosure relates to substrate processing systems and more particularly to RF power compensation to reduce variations in deposition or etch rate in response to variations in substrate bulk resistivity.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, cleaning and/or other treatment of substrates such as semiconductor wafers. During processing, a substrate is arranged on a substrate support, such as a pedestal, an electrostatic chuck (ESC), etc. in a processing chamber of the substrate processing system. A process gas mixture is introduced into the processing chamber to treat the substrate. Plasma may be struck to enhance chemical reactions within the processing chamber. An RF bias may be supplied to the substrate support to control ion energy.

SUMMARY

A substrate processing system includes a plasma generator configured to supply (radio frequency) RF power to an electrode arranged in a processing chamber. A sensor is configured to sense a parameter of the RF power supplied to the electrode. A controller is configured to compensate variations in a rate of a plasma process due to variations in bulk resistivity of a substrate arranged on a substrate support by causing the sensor to sense the parameter at least one of prior to plasma processing of the substrate and after a predetermined period after the plasma processing of the substrate begins; and adjusting the parameter of the RF power for the substrate during the plasma processing of the substrate based on the parameter sensed for the substrate.

In other features, the parameter is selected from a group consisting of an RF voltage, an RF current and an RF phase angle at a first frequency. The parameter comprises an RF voltage at a first frequency. The first frequency is less than or equal 2 MHz. The first frequency is in a range from 300 kHz to 500 kHz. The plasma generator includes a first RF source supplying at least part of the RF power at the first frequency; and a matching network including an input connected to the first RF source and an output connected to the electrode.

In other features, the plasma generator includes a second RF source supplying at least part of the RF power at a second frequency. The second RF source is connected to the input of the matching network and the second frequency is different than the first frequency. The sensor is connected between the matching network and the electrode.

In other features, the plasma processing comprises deposition of film on the substrate and the rate comprises a deposition rate. The plasma processing comprises etching of film on the substrate and the rate comprises an etching rate. The plasma processing comprises bevel deposition in a bevel etcher.

A method for operating a substrate processing system comprising supplying (radio frequency) RF power to an electrode arranged in a processing chamber; sensing a parameter of the RF power supplied to the electrode; and compensating a rate of a plasma process due to variations in bulk resistivity of a substrate arranged on a substrate support by: sensing the parameter at least one of prior to plasma processing of the substrate and after a predetermined period after the plasma processing of the substrate begins; and adjusting the parameter during the plasma processing of the substrate based on the parameter sensed for the substrate.

In other features, the parameter is selected from a group consisting of an RF voltage, an RF current and an RF phase angle of the RF power. The parameter comprises an RF voltage at a first frequency. The RF voltage has a frequency that is less than or equal 2 MHz. The RF voltage has a frequency that is in a range from 300 kHz to 500 kHz.

In other features, the method includes supplying at least a portion of the RF power using a first RF source operating at a first frequency; supplying at least a portion of the RF power using a second RF source operating at a second frequency that is higher than the first frequency; and using a matching network to match an impedance of the first RF source and the second RF source to the electrode.

In other features, the method includes sensing the parameter between the matching network and the electrode. The plasma processing comprises deposition of film on the substrate and the rate comprises a deposition rate. The plasma processing comprises etching of film on the substrate and the rate comprises an etching rate.

A substrate processing system includes a plasma generator configured to supply (radio frequency) RF power to an electrode arranged in a processing chamber. A first RF source supplies at least part of the RF power at a first frequency. A second RF source supplies at least part of the RF power at a second frequency that is greater than the first frequency. A matching network includes an input connected to the first RF source and the second RF source and an output connected to the electrode. A sensor is configured to sense a parameter of the RF power at the first frequency. A controller is configured to compensate variations in one of a deposition rate and an etching rate of a plasma process due to variations in bulk resistivity of a substrate arranged on a substrate support by: causing the sensor to sense the parameter at least one of prior to plasma processing of the substrate and after a predetermined period after the plasma processing of the substrate begins; and adjusting the parameter of the RF power for the substrate during the plasma processing of the substrate based on the parameter sensed for the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems are configured to process large numbers of substrates using a common process. To reduce defects, the process must be performed in the same manner for each substrate. For example, deposition and/or etch rates should be the same for all of the substrates processed by a recipe during a given step. However, the substrates that are supplied to the substrate processing system may have different properties that may adversely affect process uniformity. For example, the substrates delivered to a substrate processing system may have variations in bulk resistivity.

Current tools for bevel deposition experience deposition rate variations that are greater than ±17% as substrate bulk resistivity varies in a range from 1-500 Ω·cm. Similar etch rate variations are expected due to differences in substrate bulk resistivity. Some manufacturers attempt to mitigate the deposition rate variations by selecting and controlling the substrate bulk resistivity of the supplied substrates, which increases cost.

The present disclosure relates to systems and methods for dynamic RF power compensation in plasma-based substrate processing systems to mitigate deposition or etch rate variations that occur due to variations in substrate bulk resistivity. The systems and methods disclosed can perform RF power compensation for each individual substrate. In some examples, the systems and methods use an RF voltage sensor to detect the RF voltage, which is related to the substrate bulk resistivity, although other parameters such as current, phase angle, etc. can be used. A controller compensates RF power based on the measured parameter to mitigate the deposition rate change with substrate bulk resistivity variation.

For example, the RF voltage is detected during a non-deposition step and then the detected RF voltage is used to compensate RF power during a deposition step. Alternately, the RF voltage is detected at the beginning of a deposition step and then the detected RF voltage is used to compensate the RF power for the rest of the deposition step.

In other examples, the RF voltage is detected during a non-etch step and then the detected RF voltage is used to compensate RF power during an etch step. In some examples, the RF voltage is detected at the beginning of an etch step and then the detected RF voltage is used to compensate the RF power for the rest of the etch step.

While the following description relates to compensation of RF power supplied to a substrate processing system during bevel deposition to compensate for variations in substrate bulk resistivity, the principles described herein can also be used for etching in a bevel etcher. The principles may also be applied to deposition or etching in other types of plasma processing chambers and/or processes (such as plasma-enhanced chemical vapor deposition (CVD) or plasma enhanced atomic layer deposition (PEALD)).

Figure 1:
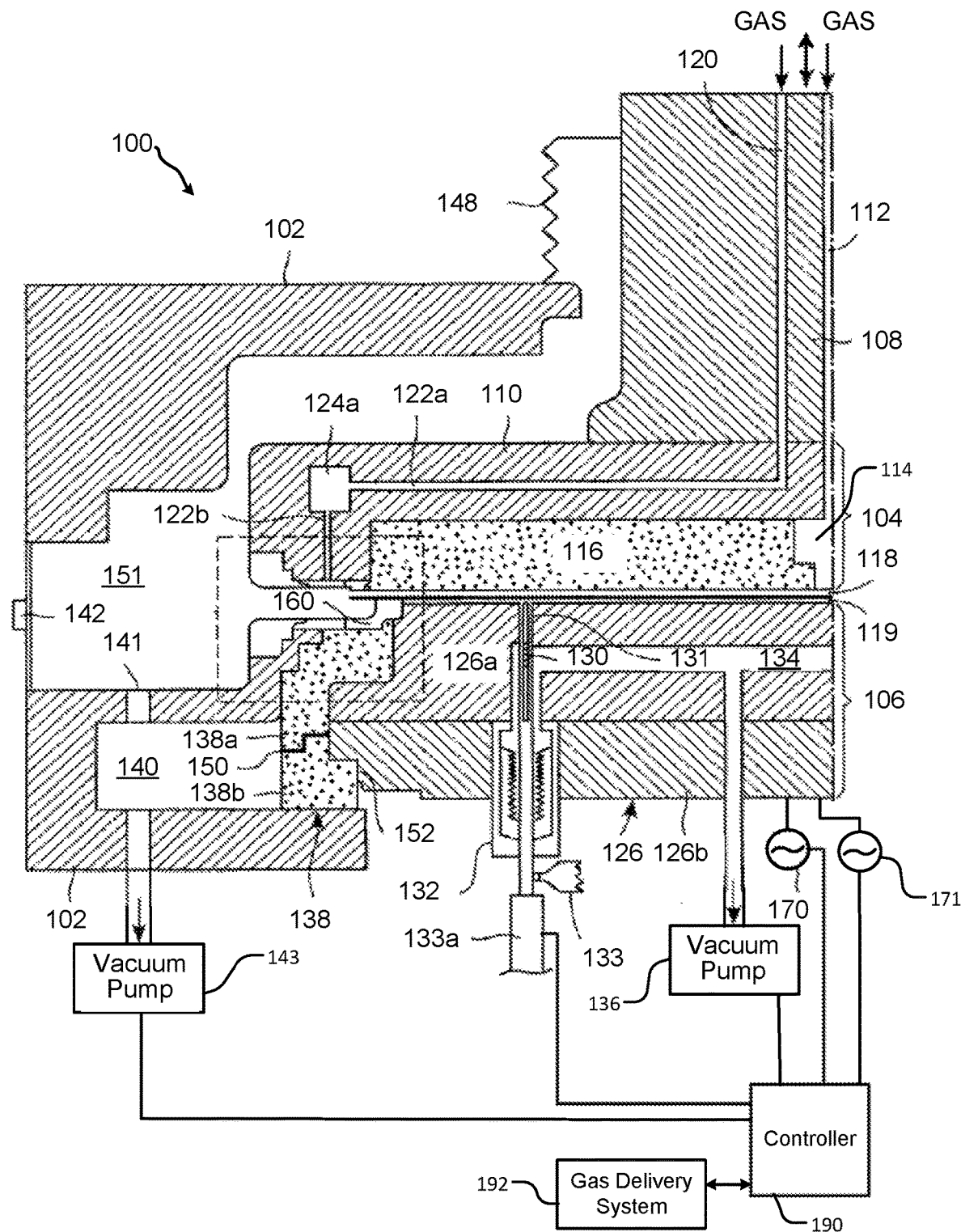
FIG. 1 is a cross-sectional view of an example of a portion of a substrate processing system according to the present disclosure.

Referring now to FIG. 1, a substrate processing system 100 for cleaning a bevel edge of a substrate 118 and/or depositing a thin film on the bevel edge of the substrate 118 is shown. The substrate processing system 100 includes a chamber wall 102 having a gate 142 through which a substrate 118 is loaded/unloaded. An upper electrode assembly 104 is connected to a support 108. The substrate processing system 100 includes a lower electrode assembly 106. An actuator (not shown) is attached to the support 108 for moving the upper electrode assembly 104 up and down (in the direction of the double arrow) to adjust the gap between the upper electrode assembly 104 and the substrate 118.

Metal bellows 148 form a vacuum seal between the chamber wall 102 and support 108 while allowing the support 108 to move vertically relative to the chamber wall 102. The support 108 has a center gas feed (passage) 112 and an edge gas feed (passage) 120. One or both gas feeds 112, 120 can deliver a plasma gas mixture to clean the bevel edge and/or to deposit a thin film thereon.

During operation, the plasma is formed around the bevel edge of the substrate 118 and is generally ring shaped. To prevent the plasma from reaching the central portion of the substrate 118, the volume between an upper dielectric plate 116 on the upper electrode assembly 104 and the substrate 118 is small and the process gas is fed from the center feed (for example, through a stepped hole 114). Then, the gas passes through the gap between the upper electrode assembly 104 and the substrate 118 in the radial direction of the substrate.

In some examples, the purge gas is injected through the center gas feed 112, while the process gas is injected through the edge gas feed 120. The plasma/process gas is withdrawn from the chamber volume 151 to the bottom volume 140 via a plurality of holes (outlets) 141. In some examples, a vacuum pump 143 can be used to evacuate the bottom volume 140 during a cleaning or deposition operation.

The upper electrode assembly 104 includes an upper dielectric plate 116 and an upper metal component 110 secured to the support 108 by a suitable fastening mechanism and grounded via the support 108. The upper metal component 110 has one or more edge gas passageways or through holes 122a, 122b and an edge gas plenum 124a. The edge gas passageways or through holes 122a, 122b are coupled to the edge gas feed 120 for fluid communication during operation. The upper dielectric plate 116 is attached to the upper metal component 110.

The lower electrode assembly 106 includes powered electrode 126 having an upper portion 126a and a lower portion 126b. A pin operating unit 132 and lift pins 130 move the substrate 118 up and down. A bottom dielectric ring 138 includes an upper portion 138a and a lower portion 138b. In some examples, the chuck includes an electrostatic chuck or a vacuum chuck. Hereinafter, the term powered electrode refers to one or both of the upper and lower portions 126a, 126b. Likewise, the term bottom dielectric ring 138 refers to one or both of the upper and lower portions 138a, 138b. The powered electrode 126 is coupled to one radio frequency (RF) power source 170 or two radio frequency (RF) power sources 170 and 171 to receive RF power during operation.

The lift pins 130 move vertically within cylindrical holes or paths 131 and are moved between upper and lower positions by the pin operating unit 132 positioned in the powered electrode 126. The pin operating unit 132 includes a housing around each lift pin to maintain a vacuum sealed environment around the pins. The pin operating unit 132 includes any suitable lift pin mechanism, such as a robot 133 (e.g., a horizontal arm having segments extending into each housing and attached to each pin) and an arm actuating device (not shown) and with a pin guide assembly 133a.

The substrate 118 is mounted on the lower electrode or on a lower configurable plasma-exclusion-zone (PEZ) ring 160. The term PEZ refers to a radial distance from the center of the substrate to the outer edge of the area where the plasma for cleaning the bevel edge or for deposition on the bevel edge is to be excluded. In an embodiment, the top surface of the powered electrode 126, the bottom surface of the substrate 118, and inner periphery of the lower configurable PEZ ring 160 can form an enclosed vacuum region recess (vacuum region) 119 in fluid communication with a vacuum source such as a vacuum pump 136. The cylindrical holes or paths for the lift pins 130 are also shared as gas passageways, through which the vacuum pump 136 evacuates the vacuum region 119 during operation. The powered electrode 126 includes a plenum 134 to reduce temporal pressure fluctuations in the vacuum region 119. In cases where multiple lift pins are used, the plenum 134 provides a uniform suction rate for the cylindrical holes.

During operation, substrate bowing can be reduced by use of a pressure difference between the top and bottom surfaces of the substrate 118. The pressure in the vacuum region 119 is maintained under vacuum during operation by a vacuum pump 136 coupled to the plenum 134. By adjusting the gap between the upper dielectric plate 116 and the top surface of the substrate 118, the gas pressure in the gap can be varied without changing the overall flow rate of the process gas(es). Thus, by controlling the gas pressure in the gap, the pressure difference between the top and bottom surfaces of the substrate 118 can be varied and thereby the bending force applied on the substrate 118 can be controlled.

In some examples, the lower portion 138b of the bottom dielectric ring has a step 152 formed on the inner periphery of its upper surface to mate with a recess on a lower edge of the powered electrode 126. In some examples, the lower portion 138b has a step 150 formed on its outer periphery to mate with a stepped surface on the upper portion 138a of the bottom dielectric ring, referred to as a focus ring. The steps 150, 152 align the bottom dielectric ring 138 with the powered electrode 126. The step 150 also forms a tortuous gap along the surface thereof to eliminate the direct line-of-sight between the powered electrode 126 and the chamber wall 102 thereby reducing the possibility of a secondary plasma strike between the powered electrode 126 and the chamber wall 102.

A controller 190 controls operation of the substrate processing system 100. The controller communicates with a gas delivery system 192 to deliver gases to the substrate processing system 100 at the appropriate times during a process. The controller 190 communicates with an RF sensor (not shown here) that senses RF voltage or RF voltage, current and phase angle. The RF sensor is installed between the RF matching network (not shown here) and the processing chamber. The controller 190 communicates with and controls the vacuum pumps 136 and 143 to control pressure in the substrate processing system. The controller 190 communicates with and controls the robot 133. The controller 190 communicates with and controls the two RF power sources 170 and 171.

Figure 2:
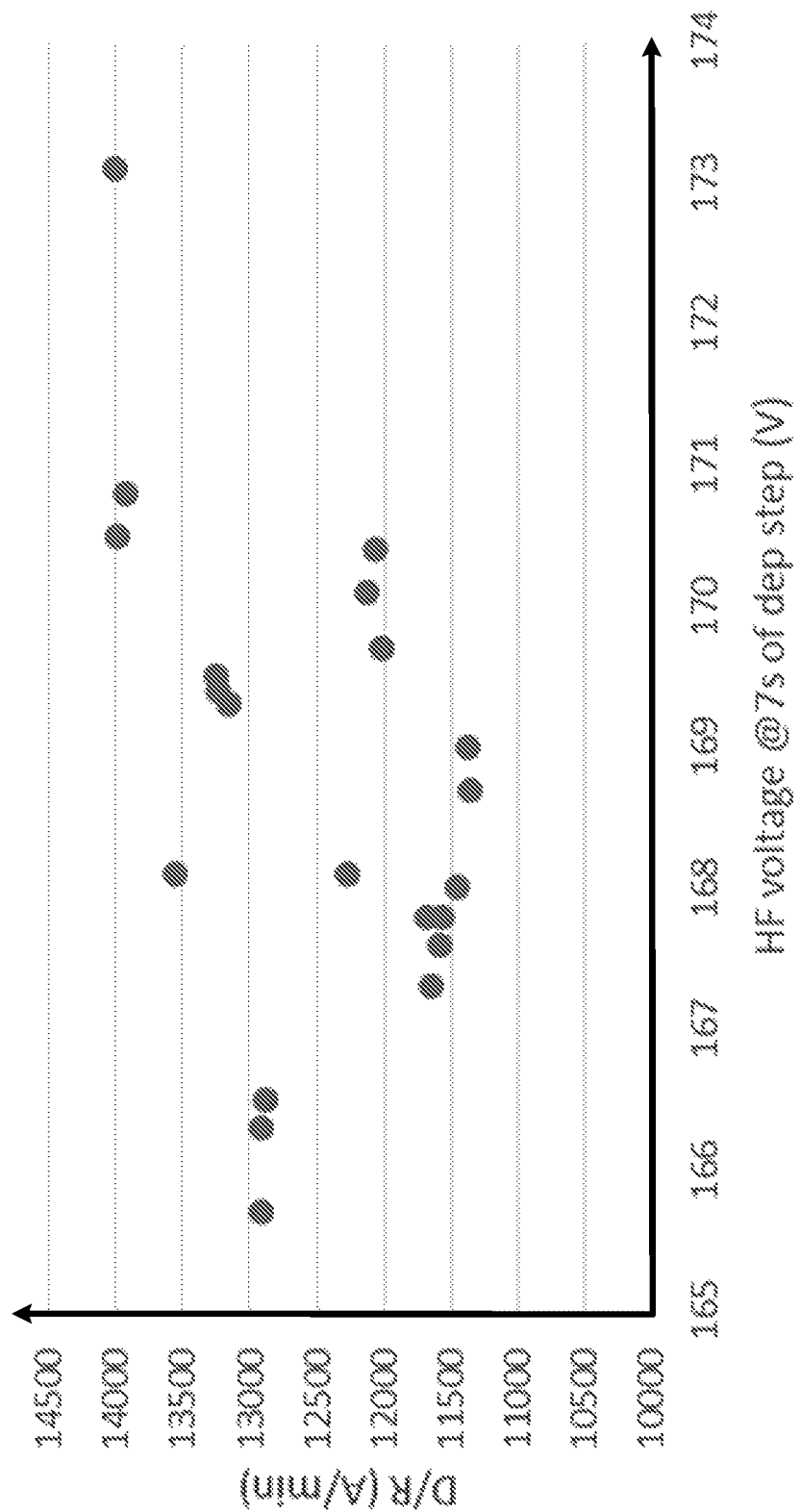
FIG. 2 is a graph illustrating an example of deposition rate as a function of HF voltage.
Figure 3:
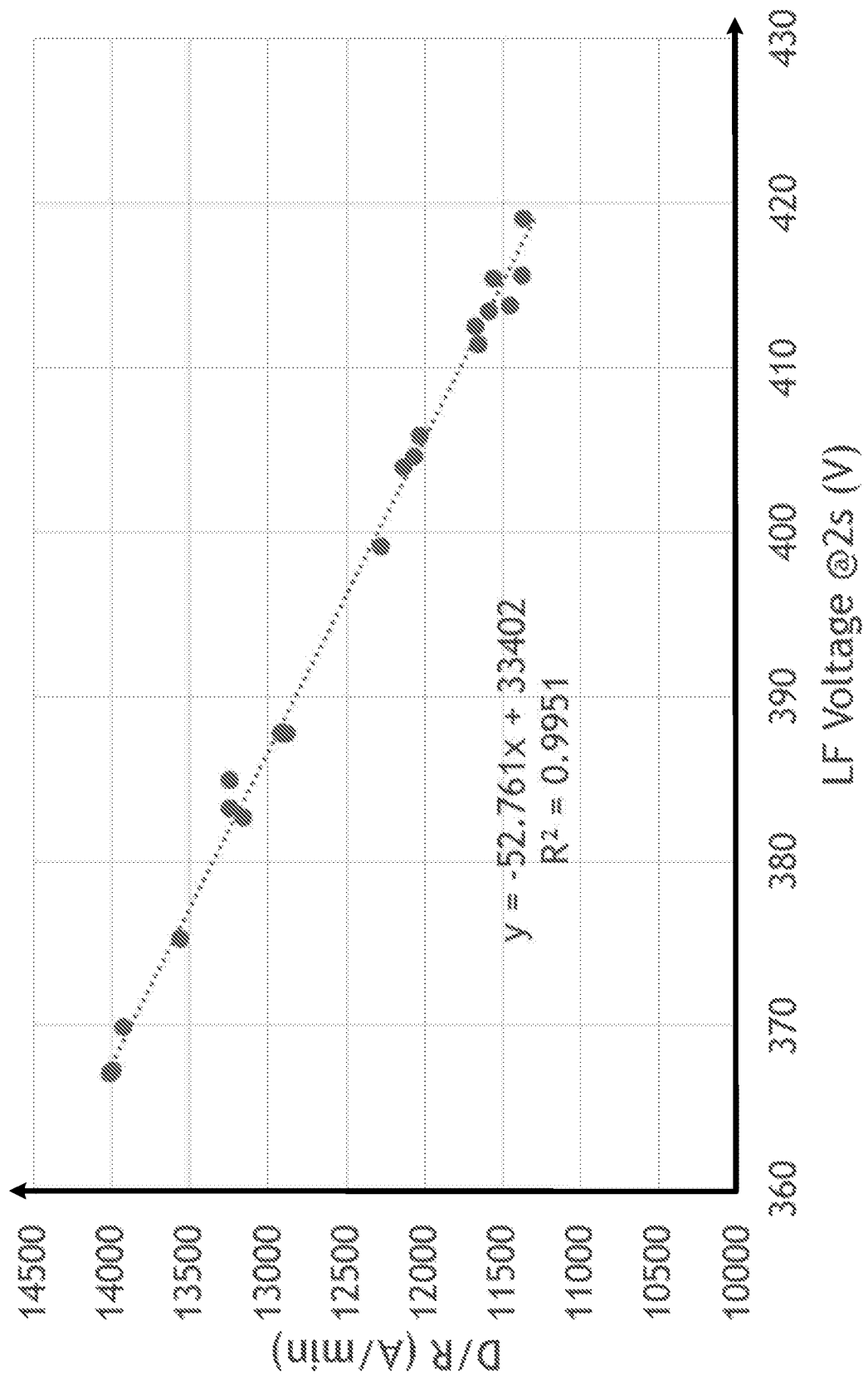
FIG. 3 is a graph illustrating an example of deposition rate as a function of LF voltage.
Figure 4:
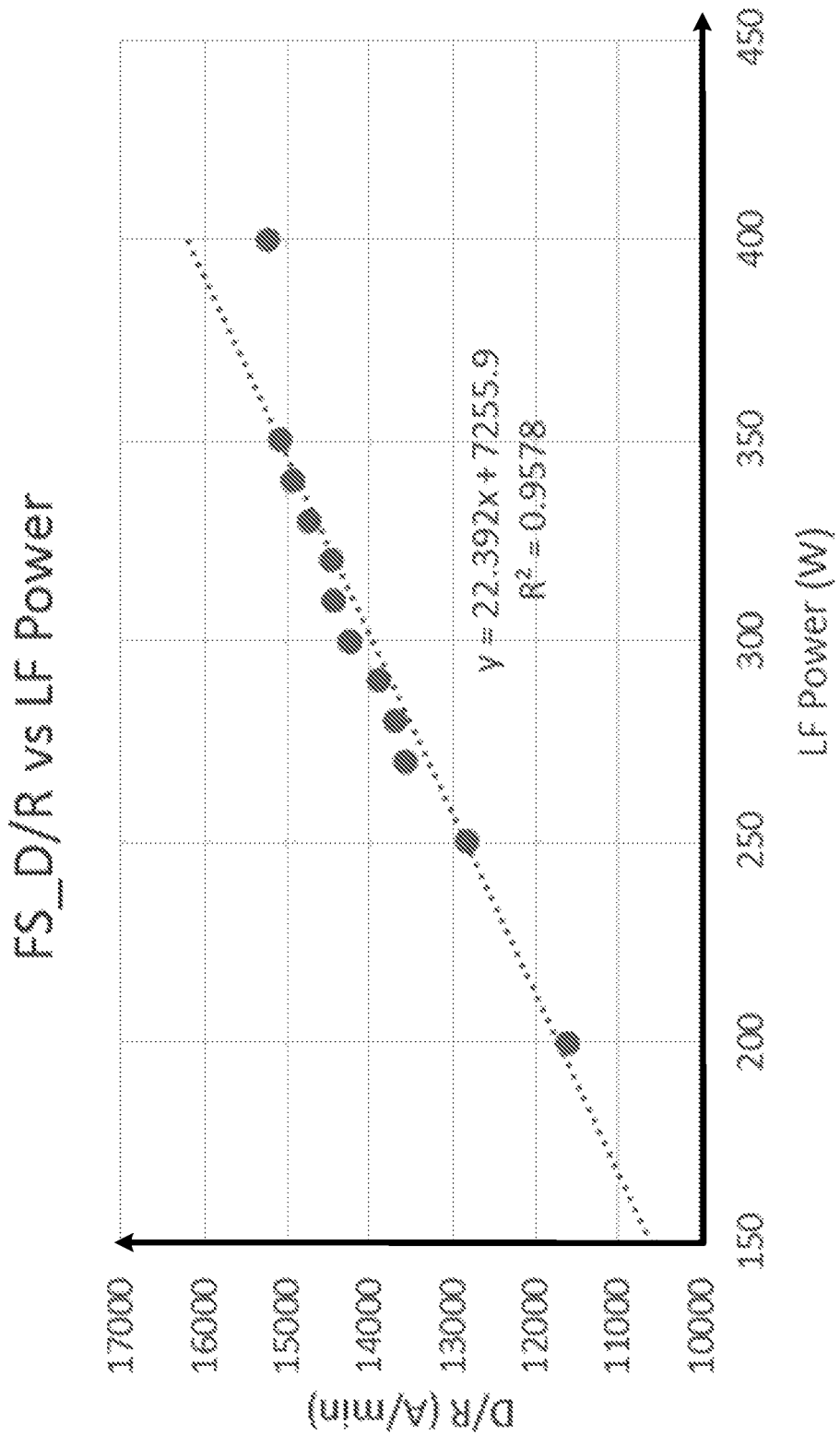
FIG. 4 is a graph illustrating an example of deposition rate as a function of LF power.

Referring now to FIGS. 2 to 4, substrate bulk resistivity will typically vary for a group of substrates that are to be processed in a processing chamber using a common recipe. As was described above, the variation in substrate bulk resistance adversely affects deposition and/or etch rate. In FIG. 2, the deposition rate is shown as a function of HF voltage as substrate bulk resistivity is varied in a predetermined resistivity range from ~1 to 500 $\Omega \cdot cm$. As used herein, HF refers to RF frequencies from 2 MHz to 120 MHz. For example, HF may refer to 13.56 MHz. As can be appreciated from FIG. 2, there is no obvious relationship between the HF voltage of the plasma and the deposition rate, and the HF voltage has a small variation from ~166V to −173V, which implies that the HF power delivered to the plasma is not much affected by different wafer bulk resistivity. Thus, the HF voltage cannot be used as an indicator of the wafer bulk resistivity for the HF power compensation to reduce the deposition rate change with wafer bulk resistivity. The variation of the HF power delivered into the plasma is not the main contributor to the deposition rate change.

In FIG. 3, the deposition rate is shown as a function of LF voltage at the deposition step as substrate bulk resistivity is varied in the predetermined resistivity range. As used herein, LF refers to lower RF frequencies less than 2 MHz. For example, LF may be in a range from 300 to 500 kHz (e.g. 400 kHz). As can be appreciated, there is a very good linear relationship between LF voltage of the plasma and the deposition rate as shown in FIG. 3. The LF voltage sampled at 2 nd second of the deposition step has wide variation from −365V to −420V, which indicates that the LF power delivered into the plasma is affected by different wafer bulk resistivity. As the wafer bulk resistivity increases, more LF power loss occurs on the wafer and less net power is delivered into the plasma, Therefore, the deposition rate is decreased with higher wafer bulk resistivity.

There is also a good linear relationship between LF power of the plasma and the deposition rate as shown in FIG. 4. Thus, the LF voltage can be used as a main indicator of the wafer bulk resistivity for LF power compensation to reduce the deposition rate change with wafer bulk resistivity. The variation of the LF power delivered into the plasma is the main contributor to the deposition rate change.

For example, when a deposition step starts, the LF voltage is detected using a sensor located between a matching network and the processing chamber at a predetermined time after plasma is struck (such as at 2 s of the deposition step). Then, the deposition rate D/R is:

$$D/R = a*V\_LF + b$$

In this example, a=−52.761 and b=33402 as shown in FIG. 3. To get the D/R of 13,000 Å/min, the LF power compensation is:

$$\Delta P = (D/R - 13000)/k$$

where k=22.392 in this example as shown in FIG. 4.

The LF power will be compensated or changed to the new compensated power right after the LF voltage sample is taken until the end of the deposition step based on:

$$P\_new = P\_original - \Delta P$$

In this example, P_original=300 W.

Combining the prior equations for LF power compensation:

$$P\_new = P\_original - (a*V\_LF + b - 13000)/k,$$

where a=−52.761, b=33402, k=22.392 in this example.

As can be appreciated, the constant parameters a, b and k are determined for each process and system by substrate running data. In other words, the equation parameters a, b and k are configurable for different processes/recipes and/or processing chambers.

Figure 5:
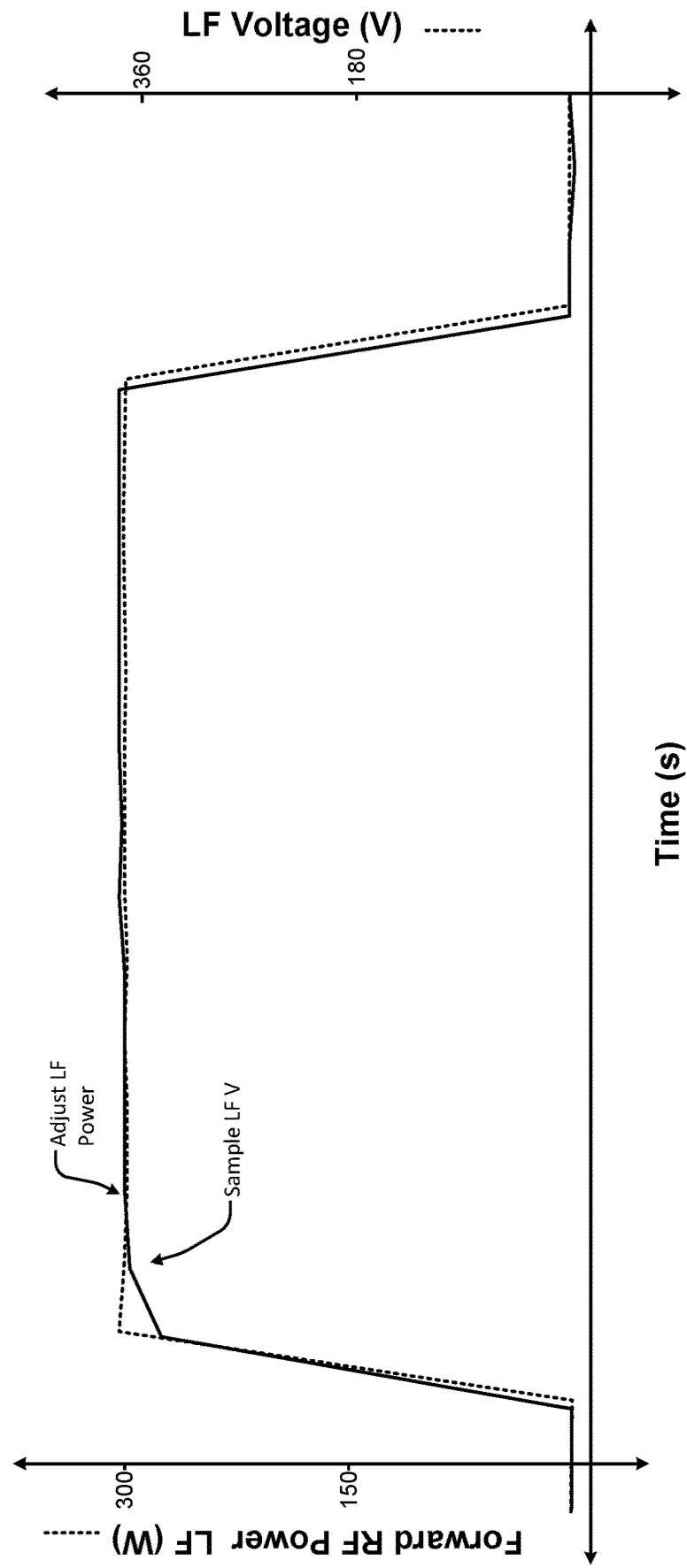
FIG. 5 is a graph illustrating forward LF power and LF voltage as a function of time.

Referring now to FIG. 5, a graph illustrating forward RF power (at LF) and LF voltage as a function of time is shown. In some examples, the sampling of the voltage is performed by the V or VI probe at a predetermined time such as 2s after striking plasma. Then the compensated LF power is applied for the rest of the deposition step after the LF voltage sampling time (e.g., sampling at 2s and compensation from 2.5s or 3.0s to the end of the deposition step). However, the LF voltage sampling can be performed during a non-deposition step. The sampled LF voltage is used to compensate the LF power during the whole deposition step.

As was described above, the LF voltage measurement may be taken when dual RF (HF+LF) plasma is present and the substrate is arranged in the processing chamber. For example, a preceding plasma processing step may be used to measure the LF voltage and the measured LF voltage can be used to compensate LF power during a subsequent plasma deposition processing step.

Figure 6:
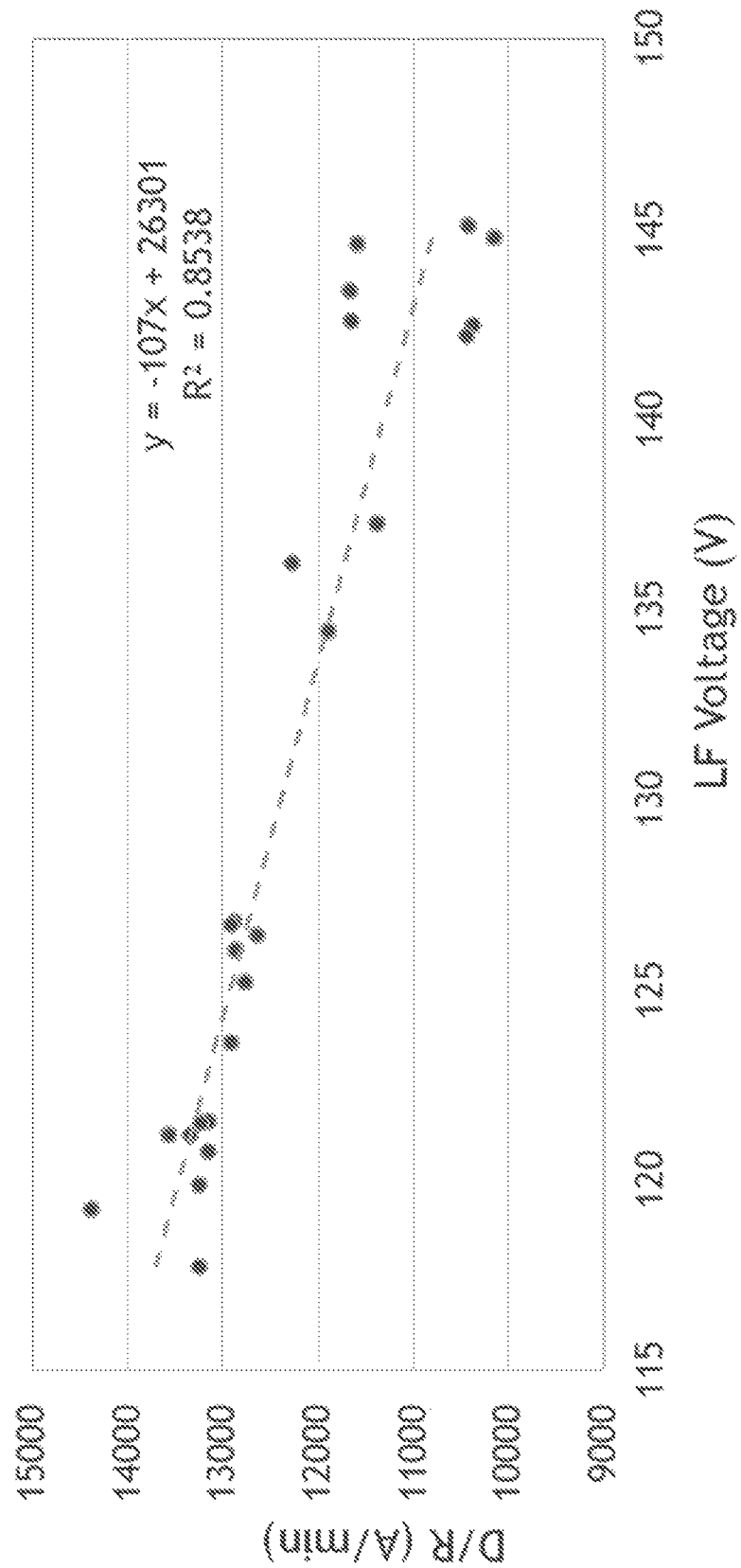
FIG. 6 is a graph illustrating an example of deposition rate as a function of LF voltage during an oxidation step.
Figure 7:
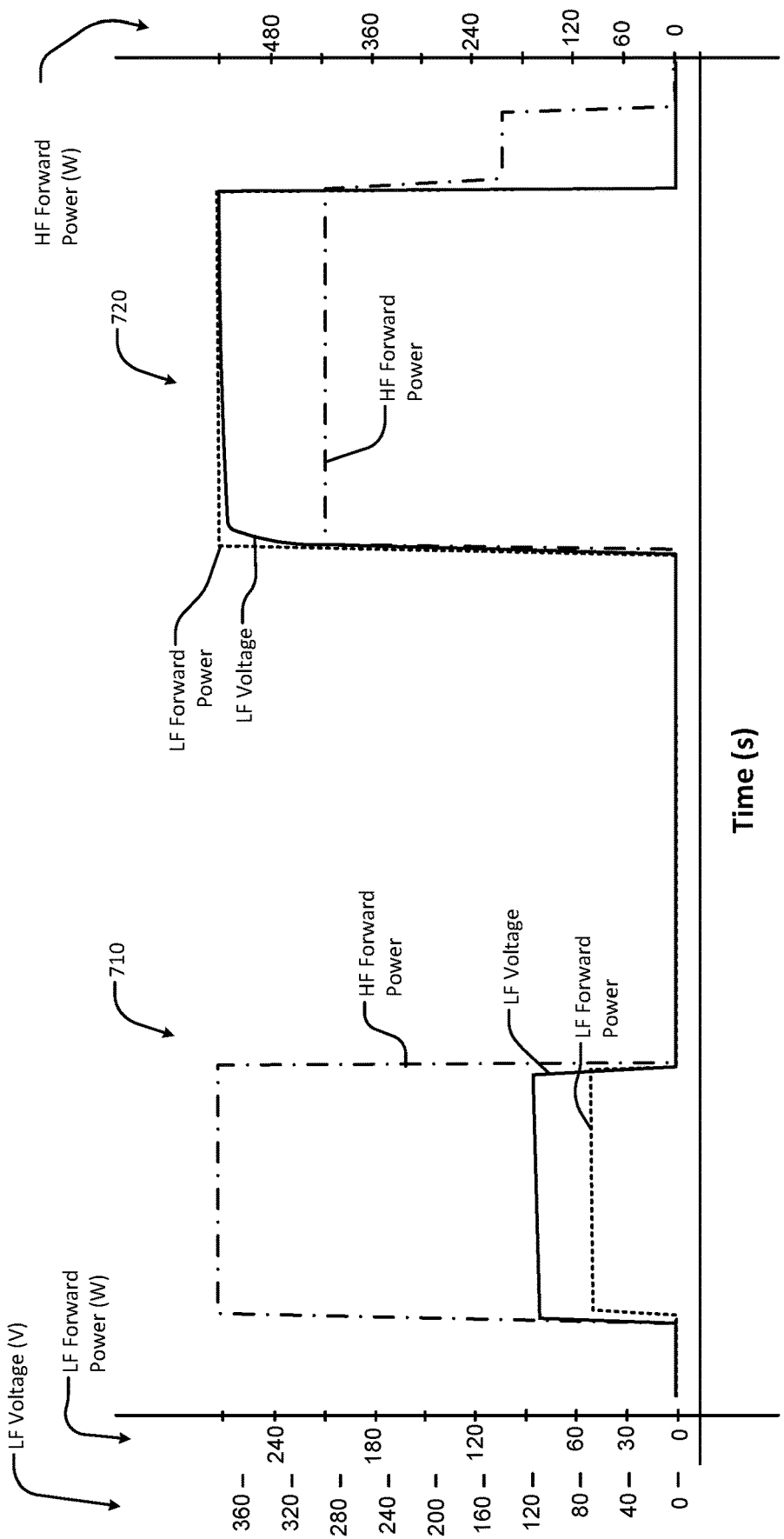
FIG. 7 is a graph illustrating an example of HF forward power, LF forward power and LF voltage during an oxidation step and LF power compensation during a deposition step.

In FIGS. 6 and 7, an example illustrates measurement of LF voltage during one step 710 (e.g. an oxidation or non-deposition step) and compensation of LF power during a subsequent deposition step 720 based on the measured LF voltage. In this example, a substrate is arranged in the processing chamber and plasma is struck in the processing chamber during both steps. In some examples, the plasma is extinguished between the two steps. In other examples, the plasma is maintained during both steps and plasma process parameters are altered between the steps. In some examples, the plasma processing steps are sequential without intervening steps. In other examples, one or more intervening substrate processing steps (plasma or non-plasma processing steps) may be performed between the plasma processing steps.

In FIG. 6, an example graph illustrates the deposition rate as a function of measured LF voltage during an oxidation (non-deposition) step. The measured LF voltage during the oxidation step is used to compensate the LF forward power during the deposition step that follows the oxidation step. As can be appreciated, the LF power compensation parameters a=−107, b=26301, k=22.392 that are obtained from FIG. 6 and FIG. 4 for the LF power compensation (using the equation (P_new=P_original−(a*V_LF+b−13000)/k)) are different than those obtained from FIG. 3 and FIG. 4 in the example above. In FIG. 7, HF forward power, LF forward power and LF voltage are shown during the oxidation step 710 and the deposition step 720. The measured LF voltage 118V at the oxidation step 710 is used to determine the new compensated LF power 274 W during the deposition step 720 that follows the oxidation step. In this RF power compensation method, the deposition rate change for wafer bulk resistivity range 1 to 500 Ω·cm is significantly reduced from +/−17% to +/−3%.

Figure 8:
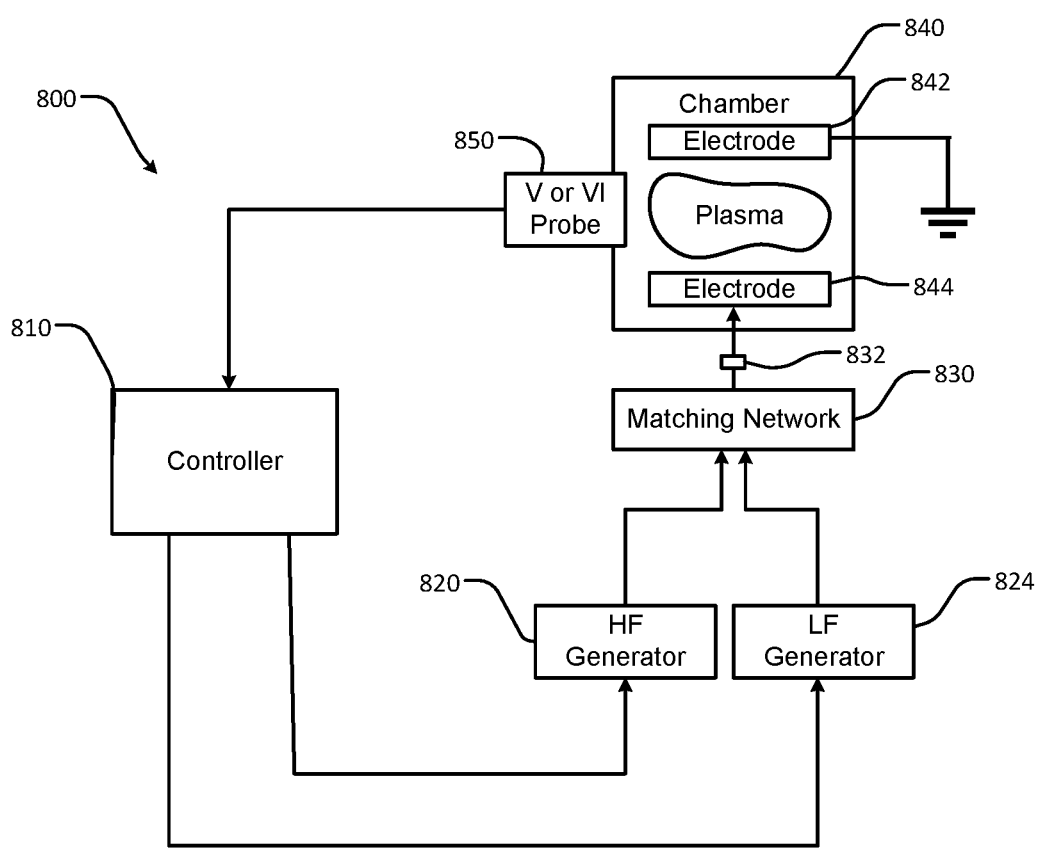
FIG. 8 is functional block diagram of an example of a control system for controlling RF power compensation according to the present disclosure.

Referring now to FIG. 8, a control system 800 for controlling/compensating RF power according to the present disclosure is shown. The control system 800 may be used in conjunction with the processing chamber shown in FIG. 1 or with other plasma processing chambers used for deposition and/or etching. The control system 800 includes a controller 810 that provides power control signals to a high-frequency (HF) generator 820 and a low frequency (LF) generator 824. The HF generator 820 generates a HF RF power that is output to a dual frequency impedance matching network 830. The LF generator 824 generates a LF RF power that is output to the dual frequency impedance matching network 830. In some examples, a RF voltage sensor or a VI probe 832 for sensing RF voltage is arranged between the dual frequency impedance matching network 830 and a processing chamber 840, although the RF voltage can be sensed in other locations around the plasma processing chamber.

The processing chamber 840 includes a first electrode 842 and a second electrode 844. The gas delivery system 192 (not displayed here) supplies a gas mixture to the processing chamber 840. In some examples, the gas delivery system 192 includes one or more gas sources connected by one or more valves, mass flow controllers and/or manifolds to the processing chamber 840.

Outputs of the HF generator 820 and the LF generator 824 are connected to one of the first electrode 842 or the second electrode 844 through the dual frequency matching network 830. The other of the first electrode 842 or the second electrode 844 is connected to a reference potential such as ground. Plasma is created when the plasma gas mixture between the first electrode 842 and the second electrode 844 is excited by the RF power. As can be appreciated, the gas mixture can include one or more deposition precursors for deposition processes or etching gases for etching processes.

The impedance matching network 830 attempts to match impedances of the HF generator 820 and the LF generator 824 with an effective impedance of the electrodes, the plasma and the processing chamber. When matched, maximum power transfer occurs without reflection. The controller 810 adjusts a power control signal supplied to the LF generator 824 based upon the measured LF voltage as measured by a voltage probe or a voltage and current (VI) probe identified at 850, which includes the 832 when the RF sensor is installed between the matching network 830 and the processing chamber 840.

Figure 9:
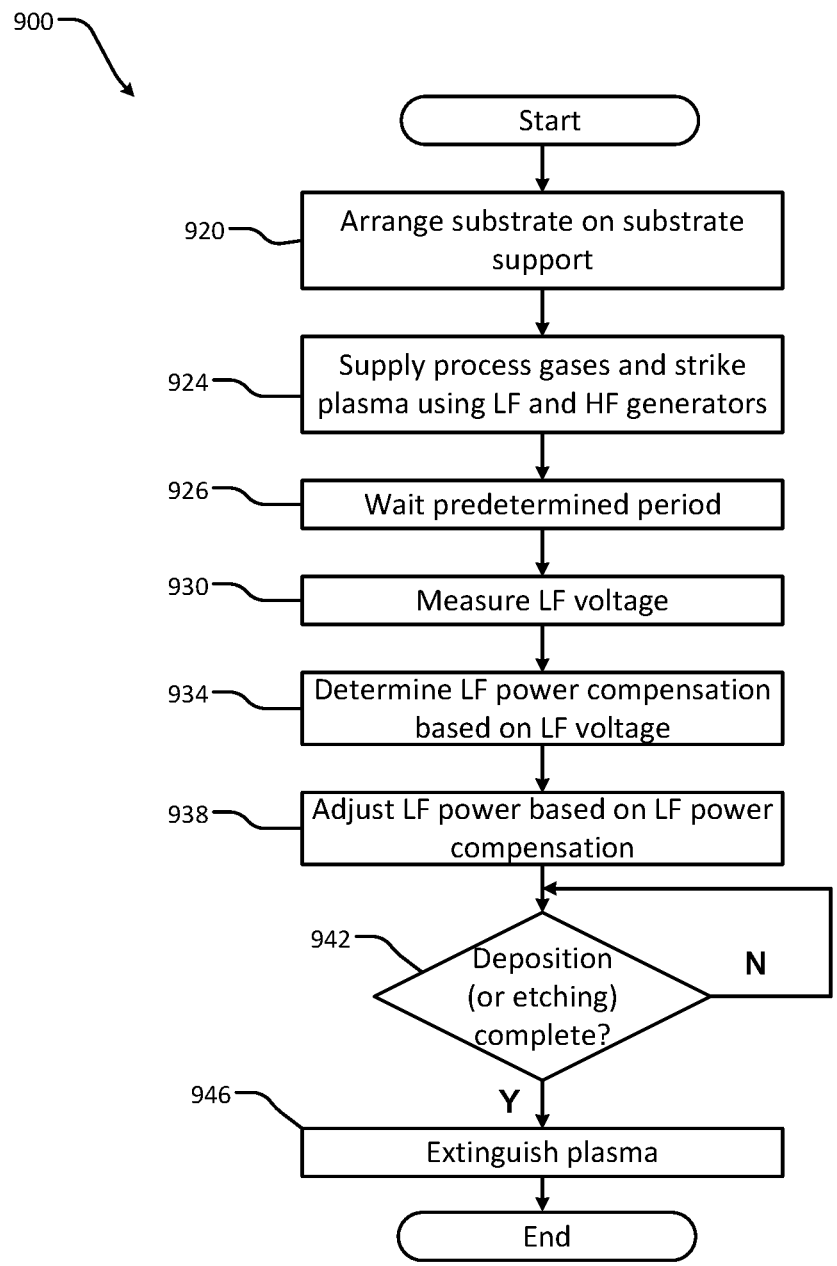
FIG. 9 is a flowchart illustrating an example of a method for controlling RF power compensation according to the present disclosure.

Referring now to FIG. 9, a method 900 for controlling/compensating RF power during deposition or etching is shown. At 920, the substrate is arranged on a substrate support (or the substrate is already present from a prior processing step). At 924, process gases are supplied to the processing chamber and plasma is struck by supplying power using LF and HF generators. If deposition is performed, the process gases include one or more precursors. If etching is performed, the process gases include one or more etching gases.

After waiting a predetermined period in 926, a parameter such as the LF voltage is measured at 930. The LF power is calculated while the substrate is located in the processing chamber and plasma is present. At 934, LF power compensation is determined as described above based on the sensed parameter (e.g. LF voltage in this example). At 938, the LF power is adjusted based on the LF power compensation calculated in 934.

At 942, the method determines whether deposition or etching is complete. If 942 is true, the method extinguishes the plasma at 946 and stops the flow of the process gases. The RF power compensation method disclosed above takes advantage of the measured RF voltage (e.g. the LF voltage). However, the same RF power compensation method may take advantage of other RF parameters such as RF current from an RF current sensor or a VI probe, phase angle from a VI probe or other parameters. In addition, the wafer bulk resistivity range described above is from ~1 to 500 Ω·cm, but the RF power compensation method is not limited to this wafer bulk resistivity range only.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a plasma generator configured to supply (radio frequency) RF power to an electrode arranged in a processing chamber;
a sensor configured to sense a parameter of the RF power supplied to the electrode; and
a controller configured to compensate variations in a rate of a plasma process due to variations in bulk resistivity of a substrate arranged on a substrate support by:
causing the sensor to sense the parameter at least one of prior to plasma processing of the substrate and after a period after the plasma processing of the substrate begins; and
adjusting the parameter of the RF power for the substrate during the plasma processing of the substrate based on the parameter sensed for the substrate.

2. The substrate processing system of claim 1, wherein the parameter is selected from a group consisting of an RF voltage, an RF current and an RF phase angle at a first frequency.

3. The substrate processing system of claim 1, wherein the parameter comprises an RF voltage at a first frequency.

4. The substrate processing system of claim 3, wherein the first frequency is less than or equal 2 MHz.

5. The substrate processing system of claim 3, wherein the first frequency is in a range from 300 kHz to 500 kHz.

6. The substrate processing system of claim 3, wherein the plasma generator includes:
a first RF source supplying at least part of the RF power at the first frequency; and
a matching network including an input connected to the first RF source and an output connected to the electrode.

7. The substrate processing system of claim 6, wherein the plasma generator includes a second RF source supplying at least part of the RF power at a second frequency, wherein the second RF source is connected to the input of the matching network and the second frequency is different than the first frequency.

8. The substrate processing system of claim 6, wherein the sensor is connected between the matching network and the electrode.

9. The substrate processing system of claim 1, wherein the plasma processing comprises one of:
deposition of film on the substrate and the rate comprises a deposition rate; and
etching of film on the substrate and the rate comprises an etching rate.

10. The substrate processing system of claim 1, wherein the plasma processing comprises bevel deposition in a bevel etcher.

11. A method for operating a substrate processing system comprising:
supplying (radio frequency) RF power to an electrode arranged in a processing chamber;
sensing a parameter of the RF power supplied to the electrode; and
compensating, via a controller, a rate of a plasma process due to variations in bulk resistivity of a substrate arranged on a substrate support by:
sensing the parameter at least one of prior to plasma processing of the substrate and after a period after the plasma processing of the substrate begins; and
adjusting the parameter during the plasma processing of the substrate based on the parameter sensed for the substrate.

12. The method of claim 11, wherein the parameter is selected from a group consisting of an RF voltage, an RF current and an RF phase angle of the RF power.

13. The method of claim 11, wherein the parameter comprises an RF voltage at a first frequency.

14. The method of claim 13, wherein the RF voltage has a frequency that is less than or equal 2 MHz.

15. The method of claim 13, wherein the RF voltage has a frequency that is in a range from 300 kHz to 500 kHz.

16. The method of claim 11, further comprising:
supplying at least a portion of the RF power using a first RF source operating at a first frequency;
supplying at least a portion of the RF power using a second RF source operating at a second frequency that is higher than the first frequency; and
using a matching network to match an impedance of the first RF source and the second RF source to the electrode.

17. The method of claim 16, further comprising sensing the parameter between the matching network and the electrode.

18. The method of claim 11, wherein the plasma processing comprises deposition of film on the substrate and the rate comprises a deposition rate.

19. The method of claim 11, wherein the plasma processing comprises etching of film on the substrate and the rate comprises an etching rate.

20. A substrate processing system comprising:
a plasma generator configured to supply (radio frequency) RF power to an electrode arranged in a processing chamber and including:
a first RF source supplying at least part of the RF power at a first frequency;
a second RF source supplying at least part of the RF power at a second frequency that is greater than the first frequency; and
a matching network including an input connected to the first RF source and the second RF source and an output connected to the electrode;
a sensor configured to sense a parameter of the RF power at the first frequency; and
a controller configured to compensate variations in one of a deposition rate and an etching rate of a plasma process due to variations in bulk resistivity of a substrate arranged on a substrate support by:
causing the sensor to sense the parameter at least one of prior to plasma processing of the substrate and after a period after the plasma processing of the substrate begins; and
adjusting the parameter of the RF power for the substrate during the plasma processing of the substrate based on the parameter sensed for the substrate.

21. A method for operating a substrate processing system comprising:
- supplying (radio frequency) RF power to an electrode arranged in a processing chamber;
- sensing a parameter of the RF power supplied to the electrode; and
- compensating a rate of a plasma process due to variations in bulk resistivity of a substrate arranged on a substrate support by:
  - sensing the parameter at least one of prior to plasma processing of the substrate and after a wait period after the plasma processing of the substrate begins; and
  - adjusting the parameter during the plasma processing of the substrate based on the parameter sensed for the substrate, wherein the parameter is at least one of a RF voltage, a RF current and a RF phase angle of the RF power supplied to the electrode.

* * * * *